(12) United States Patent
Beckers et al.

(10) Patent No.: US 9,148,163 B2
(45) Date of Patent: Sep. 29, 2015

(54) VERSATILE DETECTION CIRCUIT

(71) Applicant: SIEMENS SCHWEIZ AG, Zurich (CH)

(72) Inventors: Paul Beckers, Merzenich (DE); Daniel Brugger, Obfelden (CH)

(73) Assignee: Siemens Schweiz AG, Zurich (CH)

( * ) Notice: Subject to any disclaimer, the term of this patent is extended or adjusted under 35 U.S.C. 154(b) by 0 days.

(21) Appl. No.: 14/606,052

(22) Filed: Jan. 27, 2015

(65) Prior Publication Data
US 2015/0214972 A1 Jul. 30, 2015

(30) Foreign Application Priority Data
Jan. 27, 2014 (EP) .................................. 14152721

(51) Int. Cl.
  *H03M 1/06* (2006.01)
  *H03M 1/18* (2006.01)
  *H03K 19/0185* (2006.01)
  *H03M 1/00* (2006.01)
  *H03M 1/12* (2006.01)

(52) U.S. Cl.
  CPC ....... *H03M 1/186* (2013.01); *H03K 19/018521* (2013.01); *H03M 1/00* (2013.01); *H03M 1/12* (2013.01)

(58) Field of Classification Search
  CPC ... H03M 1/00; H03M 1/12; H03K 19/018521
  USPC .................. 341/118, 120, 155, 156; 327/333
  See application file for complete search history.

(56) References Cited

U.S. PATENT DOCUMENTS 5,608,399 A   3/1997 Coleman, Jr.
2013/0021084 A1*   1/2013 Sreenivasaiah ............... 327/333

FOREIGN PATENT DOCUMENTS

WO   9700432 A1   1/1997
WO   9839624 A1   9/1998

* cited by examiner

*Primary Examiner* — Joseph Lauture
(74) *Attorney, Agent, or Firm* — Laurence A. Greenberg; Werner H. Stemer; Ralph E. Locher

(57) ABSTRACT

A versatile detection circuit is optimized for low sensor voltages and contains a microprocessor. The microprocessor contains an integrated analog-to-digital converter with an input pin. The integrated analog-to-digital converter is configured to rely on a reference voltage of no more than 2 volts. The detection circuit also has a transformation circuit for transforming a sensor signal, the transformation circuit being connected to the input pin of the integrated analog-to-digital converter. The transformation circuit contains an impedance converter and with the exception of the impedance converter relies only on passive electric elements.

15 Claims, 5 Drawing Sheets

VERSATILE DETECTION CIRCUIT

CROSS-REFERENCE TO RELATED APPLICATION

This application claims the priority, under 35 U.S.C. §119, of European patent application EP14152721, filed Jan. 27, 2014; the prior application is herewith incorporated by reference in its entirety.

BACKGROUND OF THE INVENTION

Field of the Invention

The present disclosure relates to an electric circuit for the detection of analog and of digital signals. More specifically, the present disclosure relates to an electric circuit for signal detection that is optimized for comparably low sensor voltages.

Circuits for the detection of analog and of digital signals are frequently based on an analog-to-digital (A/D) converter. An analog-to-digital converter changes an analog signal into a digital value. A/D converters are commonly employed to change a signal from a light sensor or from a temperature-dependent resistor into a digital signal. The digital signal can then be processed by a microprocessor unit or by any other digital circuit. Apart from analog signals, A/D converters may also be used to create a digital representation of a binary (on or off) input signal from a switch.

Especially in the field of measurements and instrumentation, microprocessor units frequently contain built-in analog-to-digital converters. In other words, the microprocessor provides not only digital input pins, but also at least one analog input pin. The analog input pin is then connected to the internal A/D converter of the microprocessor unit.

Analog-to-digital converters come with given ranges of input voltages. In order to make best use of an A/D converter, the input signal to an A/D converter should ideally cover the entire range of input voltages of the converter. In order for the range of the sensor signal to match the range of the A/D converter, the sensor signal may have to be transformed.

The comparably large voltage range of the A/D converters has long been a shortcoming of microprocessors with built-in analog-to-digital converters. A large range of the input voltage of an A/D converter implies that a low-amplitude signal may cover only a part of the entire range of input voltages of the converter. A direct connection of a low-amplitude sensor signal to the wide-range input of an A/D converter then has the disadvantage of harnessing only a limited percentage of the input range of the converter. That disadvantage is often undesirable, especially when a certain digital resolution is required for the conversion of an analog signal into a digital signal. By way of example, a barometric pressure sensor will require a resolution of at least 12 bits corresponding to 4096 steps to detect also small changes in altitude. If the range of output voltages of the pressure sensor is limited to 0 . . . 2 V, then a 12 bit A/D converter with an input range of 5 V will fail to deliver a true 12 bit digital representation of the pressure signal.

To date, practical solutions based on microprocessors with built-in analog-to-digital converters often require an external A/D converter to convert analog low-amplitude signals into digital signals with adequate resolutions. The digital output of the external analog-to-digital converter is then connected to the digital input of the microprocessor. The additional external A/D converter with a low range of input voltages adds to the complexity of the circuit and is yet another element prone to failure.

When an external A/D converter is not an option, an amplifier may be used to enlarge the voltage range of a sensor signal. The output of the amplifier is then connected to an analog input pin of the microprocessor with a built-in A/D converter. In this configuration, the amplifier needs to be highly linear in order to not impair the quality of the digital representation of the analog signal. The amplifier also comes with the disadvantages of the aforementioned external A/D converter.

SUMMARY OF THE INVENTION

It is accordingly an object of the invention to provide a versatile detection circuit that overcomes the above-mentioned disadvantages of the prior art devices of this general type which at least mitigates the aforementioned difficulties and provides detection circuits for digital and for analog signals that meet the aforementioned requirements.

With the foregoing and other objects in view there is provided, in accordance with the invention, a detection circuit optimized for low sensor voltages. The detection circuit contains a microprocessor having an integrated analog-to-digital converter with an input pin, the integrated analog-to-digital converter is configured to rely on a input voltage range of no more than 2 V. A transformation circuit is provided for transforming a sensor signal. The transformation circuit is connected to the input pin of the integrated analog-to-digital converter. The transformation circuit has an impedance converter and a plurality of only passive electric components, with an exception of the impedance converter the transformation circuit relies on the plurality of only passive electric components.

The present disclosure is based on a discovery related to the advent of microprocessors with integrated A/D converters. This new class of microprocessor devices allows for the processing of low-voltage input signals with reduced complexity of the detection circuit.

It is an object of the present disclosure to provide a versatile detection circuit for low-amplitude electric signals. It is a related object of the present disclosure to come up with a detection circuit that relies on a microprocessor with a built-in analog-to-digital converter. Advantageously, a low reference voltage may be chosen at corresponding pin of the microprocessor.

The above problems are resolved by a detection circuit for low-voltage signals according to the main claim of this disclosure. Preferred embodiments of the present disclosure are covered by the dependent claims.

It is another object of the present disclosure to provide a detection circuit that allows for the processing of low-voltage analog signals.

It is a related object of the present disclosure to provide a detection circuit that allows for the processing of low-voltage analog signals obtained from temperature-dependent resistors.

It is a related object of the present disclosure to provide a detection circuit that allows for the processing of low-voltage analog signals coming from positive thermal coefficient resistors.

It is a related object of the present disclosure to provide a detection circuit that is configured to process low-voltage analog signals coming from negative thermal coefficient resistors.

It is a related object of the present disclosure to provide a detection circuit for low-voltage analog signals that is configured to process both negative and positive input voltages.

It is another object of the present disclosure to provide a detection circuit that allows for the processing of low-voltage digital signals.

It is a related object of the present disclosure to come up with a detection circuit for low-voltage digital signals that allows for noise reduction and/or noise cancellation.

Other features which are considered as characteristic for the invention are set forth in the appended claims.

Although the invention is illustrated and described herein as embodied in a versatile detection circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
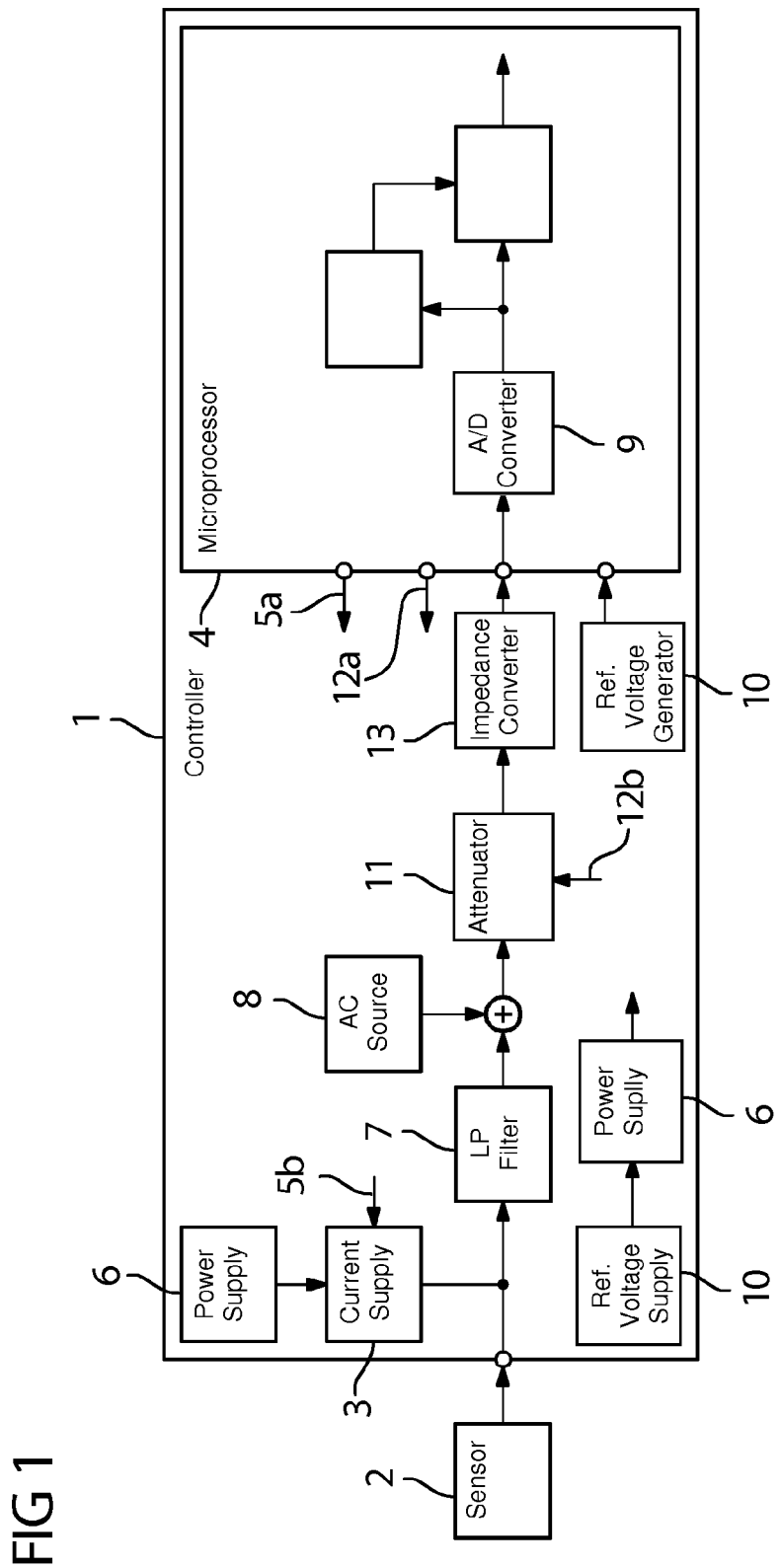
FIG. 1 is a block diagram providing an overview of various steps of signal processing by a microprocessor embedded in a controller according to the invention.

Referring now to the figures of the drawings in detail and first, particularly to FIG. 1 thereof, there is shown a controller 1 with a sensor 2 attached. The sensor 2 could, by way of example, be a photodiode, a temperature-dependent resistor, an acceleration sensor, a (barometric) pressure sensor or similar. The sensor 2 in the context of this application could also be a (mechanical) switch or a voltage source.

The controller 1 provides a current supply 3. The current supply 3 will be in use typically when the sensor 2 is a resistor or a switch. The current supply 3 may be switched off when the sensor 2 is a voltage supply.

The current supply 3 can be switched on and off through the microprocessor 4. To that end, the current supply 3 comes with a port 5b that is connected to a port 5a of the microprocessor 4. The microprocessor 4 is configured to send a CSS signal to the current supply 3 through the ports 5a, 5b in order to switch on or off the supply 3.

The current supply 3 is also connected to a power supply 6. In a preferred embodiment, the voltage supplied by the power supply 6 is +18 V or +19 V. In an advantageous embodiment, the magnitude of the current produced by the current supply 3 is proportional to the reference voltage. The dependence of the current from the current supply 3 on the reference voltage 10 helps mitigate the influence of variations in the reference voltage 10 on signal processing.

The power supply 6 receives a reference voltage 10 to vary the voltage supplied by the power supply 6 and the current supplied by the current supply 3. The reference voltage would typically be 1.7 V. In another embodiment, the reference voltage is 2 V.

A reference voltage 10 also sets a maximum input range of the A/D converter 9. A low value of the reference voltage 10 reduces the current through and hence the stress on the sensor 2.

The sensor 2 is also connected to a low-pass filter 7. The low-pass filter 7 suppresses noise with frequencies above the mains frequency. In a preferred embodiment, the low-pass filter 7 provides a capacitor. The capacitor may prove useful whenever the sensor 2 is a switch. Upon closing the switch, the capacitor provides an extra current to help clean the contacts of the (mechanical) switch by removal of an oxide layer. The extra current supplied by the capacitor of the low-pass filter 7 may also reduce contact bounce.

In a particular embodiment, the low-pass filter 7 is a first-order RC or LC or RLC filter. In another embodiment, the low-pass filter is a Butterfly-type filter. In yet another embodiment, the low-pass filter is a Chebyshev-type filter. The latter two embodiments employ higher-order filters to better reduce 1/frequency noise that adds to the (weak) signal produced by the low-voltage sensor 2.

The controller 1 also provides a source 8 of alternating (AC) voltage to be added to the sensor signal. The source 8 of AC voltage introduces a technique known as oversampling. In a preferred embodiment, the frequency of the AC voltage is 270 Hz. The amplitude of the alternating voltage from the AC source 8 is typically about 15 mV. In a particular embodiment, the voltage supplied by the AC source 8 has a triangular shape. In another embodiment, the AC source 8 generally supplies a noise signal.

The controller 1 further provides an attenuation element 11. The attenuation element 11 is predominantly used together with sensors 2 that are −1 . . . +11 V voltage sources, digital sensors, or high-impedance negative thermal resistance (NTC) sensors. In any of these cases, the voltage drop over the sensor 2 would exceed the maximum input voltage to be supplied to the A/D converter 9. The attenuation element 11 reduces an amplitude of the signal. In a preferred embodiment, the reduction in amplitude is generally proportional to the amplitude of the signal coming from the sensor 2. The attenuation element 11 provides an input port 12b. Through the input port 12b, the attenuation element 11 can receive a MRS signal from an output port 12a of the microprocessor 4. The microprocessor thus enables and disables the attenuation element 11 depending on whether attenuation is needed.

An impedance converter 13 is an optional element of the controller 1. The impedance converter 13 is required whenever due to an ambient temperature dependence the input current of the A/D converter 9 becomes excessive. The impedance converter 13 then ensures current fed to the A/D converter 9 will suffice.

The analog-to-digital converter 9 preferably samples its input signal during 100 ms at a sampling rate of 2.5 kHz. In other words, the A/D converter 9 acquires 250 values. The values are then stored inside the microprocessor 4 for further processing. Through averaging a mean value with a higher resolution is obtained. With the AC signal added by the AC source 8, averaging of the signal improves on the resolution of the A/D converter 9 through oversampling. That way, the resolution can be increased from 12 bits to 14 bits or even to 16 bits. The frequency of the AC voltage supplied by the AC source 8 will be chosen accordingly and may actually be above 270 Hz.

In another embodiment, processing by the microprocessor 4 means detection of the mains frequency. The phase of the mains frequency may also be detected. The signal detected by the sensor 2 is often affected by the mains frequency. In addition, the mains frequency may influence the sensor 2 signal through electromagnetic interference. After sampling the signal during 100 ms, the microprocessor 4 detects the zero-crossing of the mains component of the signal frequency. The microprocessor 4 then determines the frequency at a resolution of preferably 0.1 Hz and/or also the phase of the mains component. The influence of the mains component may then be suppressed through a digital notch filter.

The controller preferably provides no element to amplify the voltage of the signal from the sensor 2. The arrangement is particularly advantageous, since it avoids sacrificing part of the resolution of the A/D converter 9. To attain this result, a microcontroller 4 is used with an integrated A/D converter 9 that relies on a comparably low reference voltage.

Figure 2:
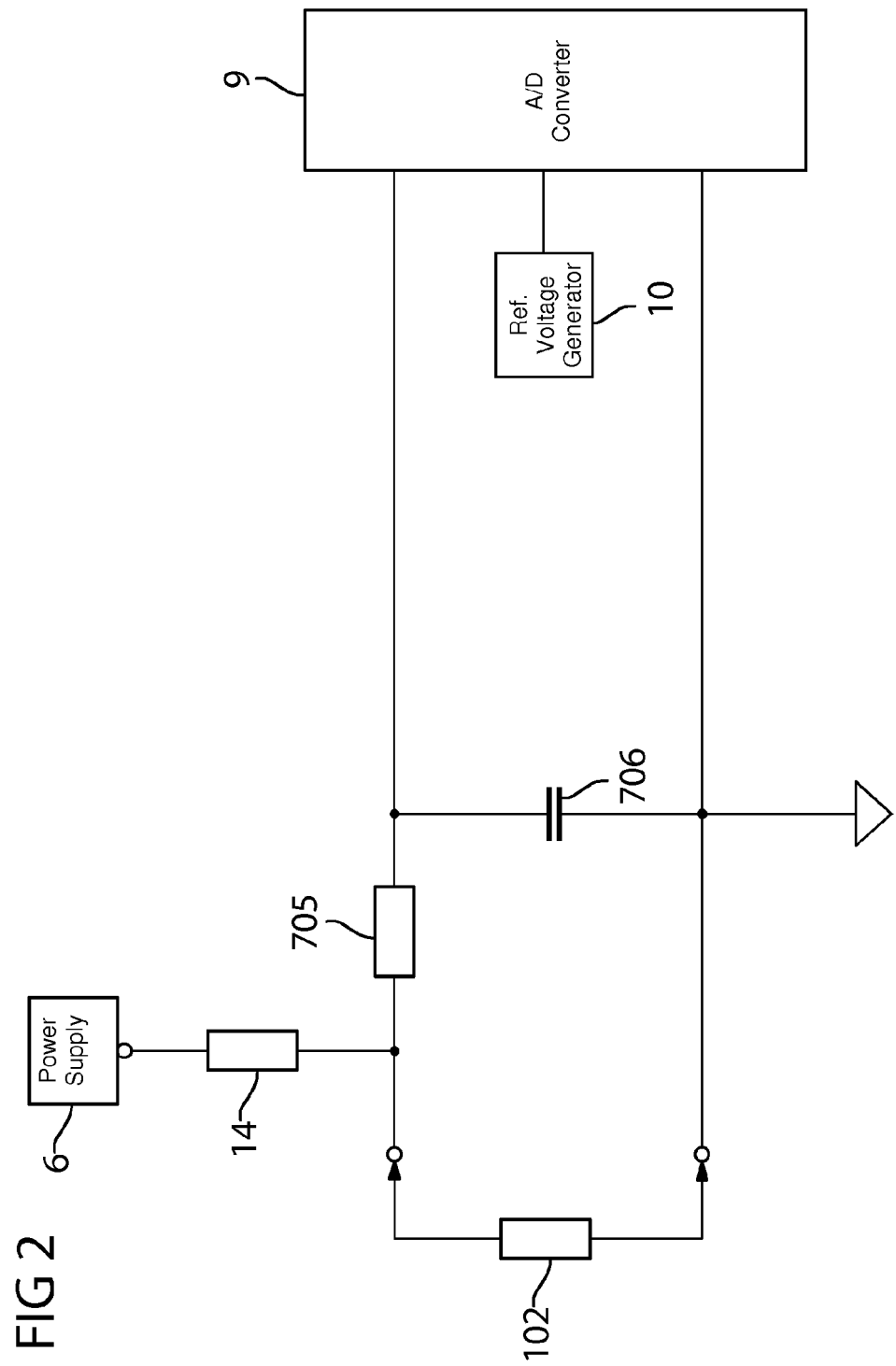
FIG. 2 is a block diagram of a special embodiment of a general concept of FIG. 1 showing a detection circuit specially adapted to resistors up to 1.5 k Ohm.

Now turning to FIG. 2, an exemplary embodiment with resistive sensors 102 is described. The detection circuit of FIG. 2 has been adapted with particular emphasis on a resistive sensor 102 with resistance values of up to 1.5 k Ohm. Typical examples of such sensors are Pt1000 or Ni1000 sensors.

In order to apply a voltage of 1.7 V to the resistive sensor 102, the supply voltage is lowered by a resistor 14. With a $V_{VCS}$ being the supply voltage by the power supply 6, $R_{sens}$ being the resistance of the sensor, $R_{14}$ being the resistance of resistor 14, the voltage $V_{IN}$ to ground at the input of the A/D converter 9 reads $$V_{IN}=V_{VCS}*R_{sens}/(R_{sens}+R_{14}).$$

The resistor 705 and the capacitor 706 form the low-pass filter 7 described above in the context of FIG. 1.

Figure 3:
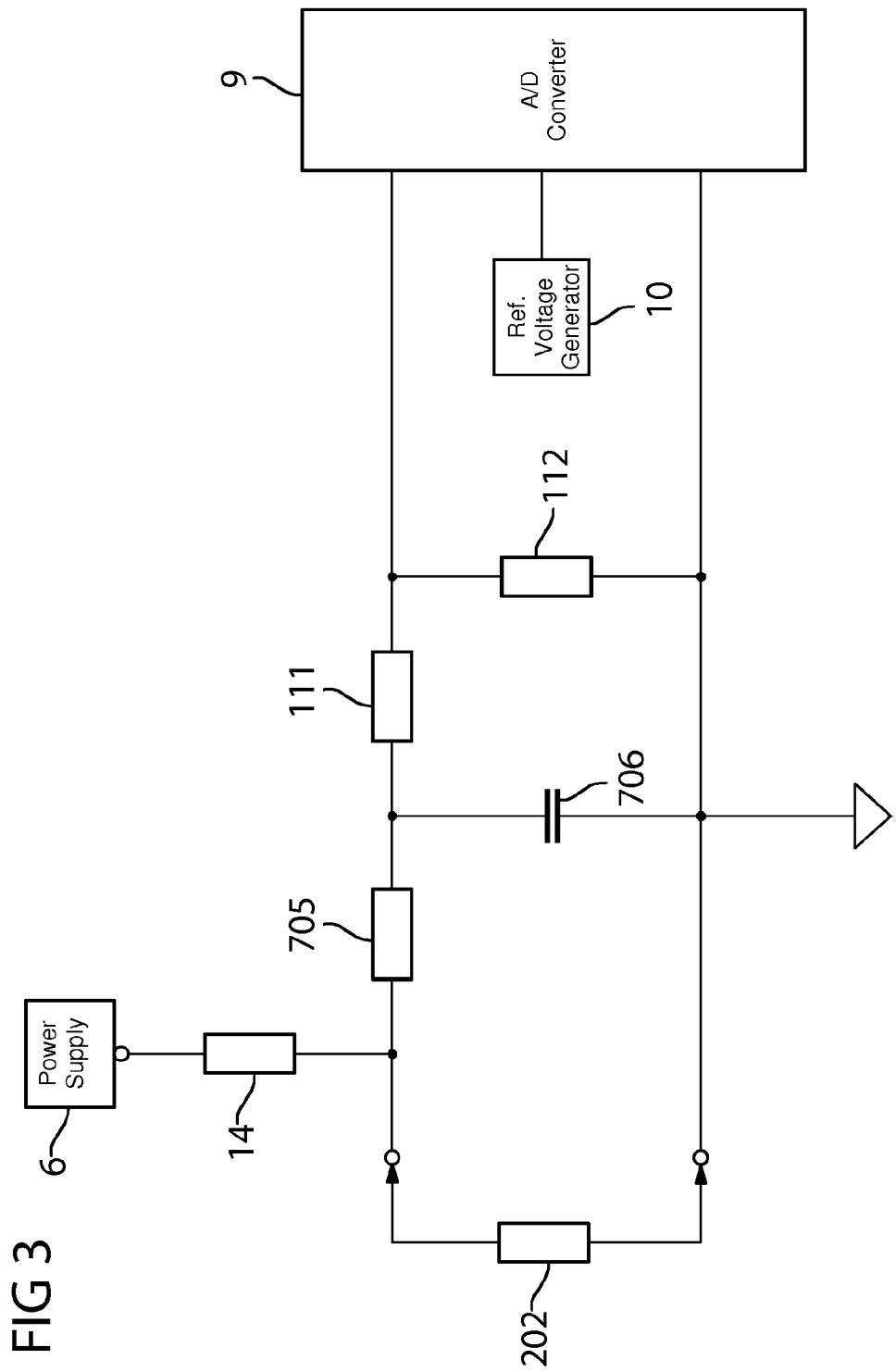
FIG. 3 is a block diagram of a special embodiment of the general concept of FIG. 1 showing the detection circuit specially adapted to resistors up to 600 k Ohm.

Now turning to FIG. 3, a detection circuit specially adapted to resistive sensors 202 with resistance values of 0.1 k Ohm to 600 k Ohm is described. A negative thermal resistance sensor is a typical example in this category of sensors. The circuit also differs from the circuit of FIG. 2 in that it contains an attenuation element made up of the resistors 111 and 112. The attenuation element basically is a resistive voltage divider made up of the resistors 111 and 112. The same attenuation element is in principle known from element 11 of FIG. 1.

With the symbols as described in the context of FIG. 2 and with $R_{111}$ and with $R_{112}$ forming the attenuation element, the input $V_{IN}$ to the A/D converter reads $$V_{IN}=V_{VCS}*R_{sens}//(R_{705}+R_{111}+R_{112})/(R_{sens}//(R_{705}+R_{111}+R_{112})+R_{14})*R_{112}/(R_{705}+R_{111}+R_{112}).$$

Figure 4:
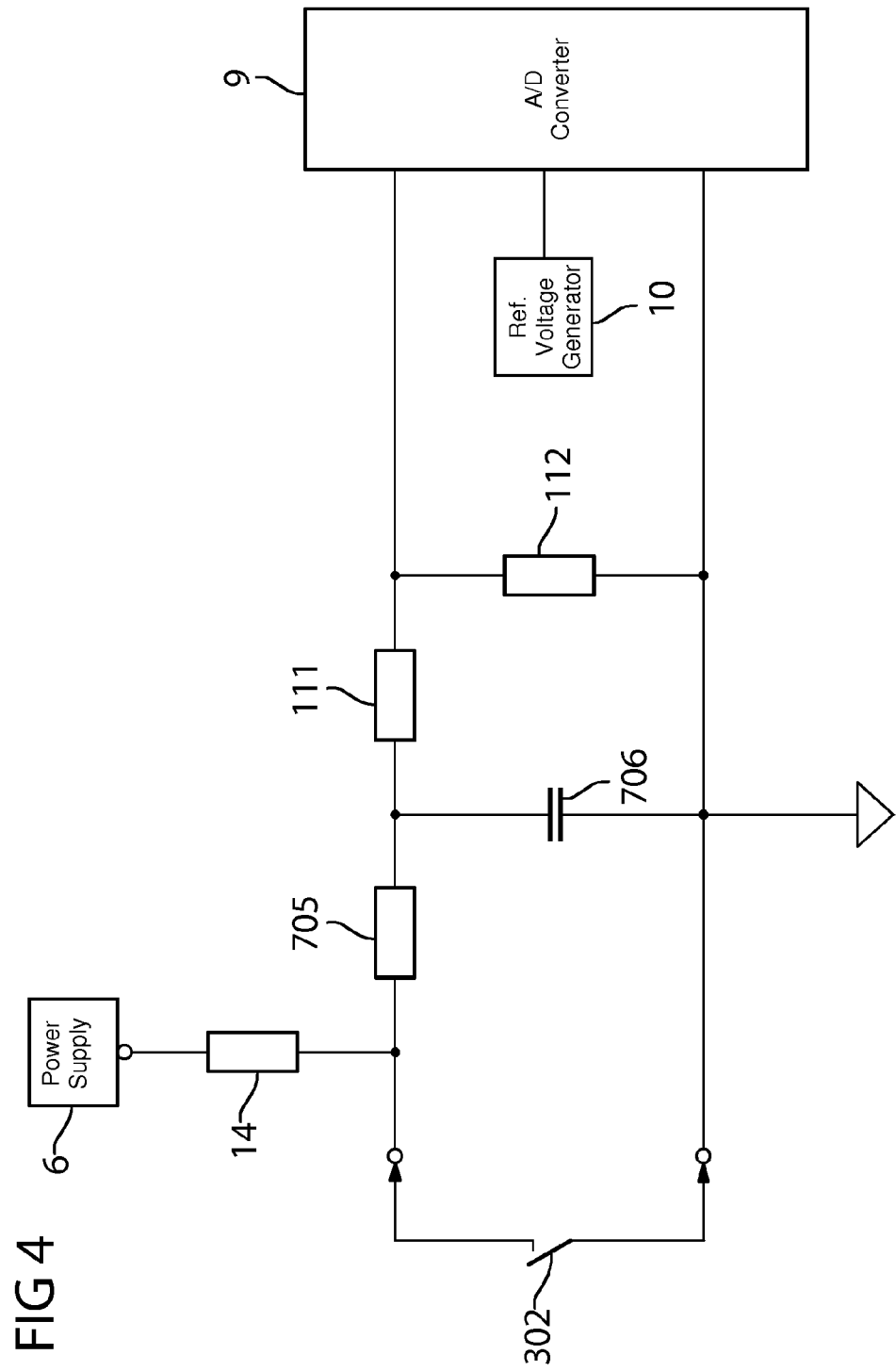
FIG. 4 is a block diagram of special embodiment of the general concept of FIG. 1 showing the detection circuit suited for the detection of a state of a (mechanical) switch.

The circuit as shown in FIG. 4 is adapted for values of the sensor 202 resistance of less than 600 k Ohm.

FIG. 4 shows a detection circuit configured to receive a switch 302 as its sensor. The circuit of FIG. 4 differs from the circuit of FIG. 3 only in that the resistive sensor 202 has been replaced by the switch 202.

The capacitor 706 as shown in FIG. 4 is not only part of the low-pass filter. The capacitor 706 also drives a current through the switch 302 upon closing of the (mechanical) contacts of the switch 302. The extra current from the capacitor 706 helps reduce contact bounce by clearing oxide layers on the surfaces of the contacts.

Figure 5:
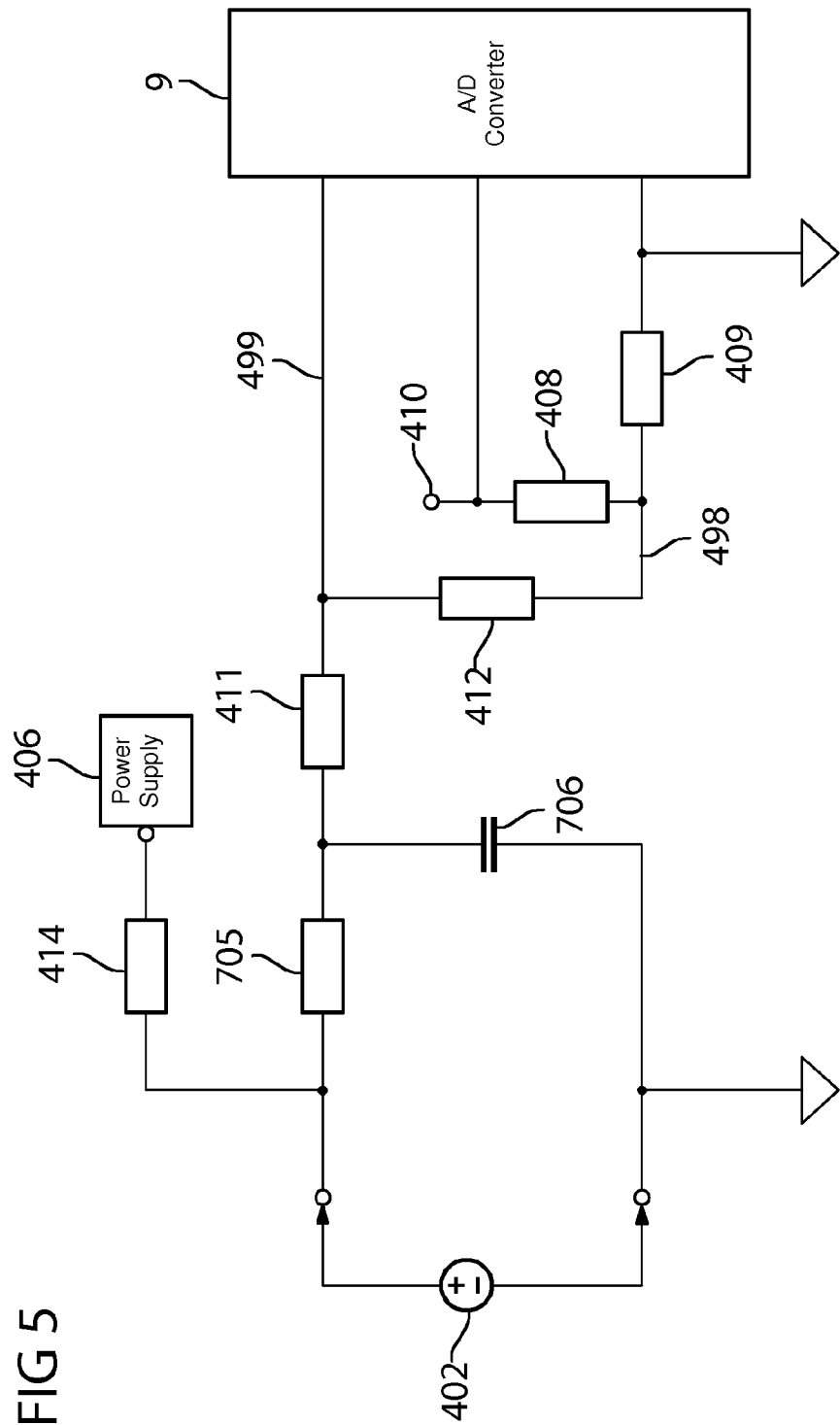
FIG. 5 is block diagram of a special embodiment of the general concept of FIG. 1 showing the detection circuit for the detection and for the measurement of voltages between −1 V and +11 V.

Now turning to FIG. 5, a circuit for detecting and measuring voltages between −1 V and +11 V is presented. The predominant difference compared to the previous figures is that the sensor 2 has now been replaced by a voltage source 402. The voltage source 402 is connected to an power supply 406. Preferably, the power supply 406 delivers a voltage of −3 V. A resistor 414 together with the −3 V supply 406 allows for the detection of open circuits, when no resistor 414 is connected to the circuit. The power supply 406 and the resistor 414 are optional elements.

A low-pass filter made up of the elements 705 and 706 basically performs the same function as in the previous figures.

The resistors 411 and 412 form a resistive voltage divider. In a particular embodiment, the voltage $V_{IN}$ at the input of the analog-to-digital converter attains a maximum of 1.1 V.

The voltage reference 410 separated from point 498 through a resistor 408. The resistor 409 increases the voltage at point 498 to approximately 0.1 V. The small increase in voltage at point 498 allows the circuit to also measure and to detect negative voltages at the sensor 402.

With the symbols as per the previous figures, with $R_{408}$ and $R_{409}$ being the resistance values of the resistors 408 and 409, with $V_{410}$ being the voltage at point 410, and with $V_{402}$ being the voltage of the sensor 402, the voltage $V_{IN}$ reads $$V_{IN}=V_{402}*R_{412}/(R_{705}+R_{411}+R_{412})+V_{410}*(R_{409}/(R_{408}+R_{409}))*R_{411}/(R_{411}+R_{412}).$$

With the exception of the impedance converter, the foregoing embodiments rely only on passive electric components for the transformation of the sensor signal. In other words, the circuits for the transformation of the sensor signal (2, 102, 202, 302, 402) contain no amplifier to (proportionally) increase the voltage amplitude of the sensor (2, 102, 202, 302, 402) signal. Passive electric components contain resistors, capacitors, and coils. Transistors or other semiconducting switches are not considered passive electric components.

The power supplies 6, 406, the current supply 3, the generator of the reference voltage 10, and the AC source 8 are not considered to be part of the transformation circuit. They 3, 6, 8, 10, 406 are instead supply components.

It should be understood that the foregoing relates only to certain embodiments of the invention and that numerous changes may be made therein without departing from the spirit and the scope of the invention as defined by the following claims. It should also be understood that the invention is not restricted to the illustrated embodiments and that various modifications can be made within the scope of the following claims.

The following is a summary list of reference numerals and the corresponding structure used in the above description of the invention:

1 controller
2 sensor
3 current supply
4 microprocessor
5a, 5b ports for switching on and off the current supply 3
6 power supply
7 low-pass filter
8 source of alternating voltage
9 analog-to-digital converter
10 voltage reference
11 attenuator
12a, 12b ports for switching on and off the attenuator 11
13 impedance converter
14 resistor to define the voltage applied to the sensor
102 sensor with a resistivity of up to 1.5 kOhm
111, 112 resistors that form a resistive divider (attenuator)
202 sensor with a resistivity of up to 600 kOhm
302 (mechanical) switch

402 voltage source
406 source for the detection of open sensor contacts
408 resistor to separate the voltage reference 410 and point 498
409 resistor to raise the potential of point 498
410 voltage reference
411, 412 resistors that form a resistive divider (attenuator)
414 resistor for the detection of open sensor contacts
498 point with raised potential
499 input port of the analog-to-digital converter 9
705, 706 resistor and capacitor of the low-pass filter

The invention claimed is:

1. A detection circuit optimized for low sensor voltages, comprising:
   a microprocessor having an integrated analog-to-digital converter with an input pin, said integrated analog-to-digital converter configured to rely on a input voltage range of no more than 2 V; and
   a transformation circuit for transforming a sensor signal, said transformation circuit being connected to said input pin of said integrated analog-to-digital converter, said transformation circuit having an impedance converter and a plurality of only passive electric components, with an exception of said impedance converter said transformation circuit relies on said plurality of only passive electric components.

2. The detection circuit according to claim 1, wherein said transformation circuit with the exception of said impedance converter includes said plurality of only passive electric components.

3. The detection circuit according to claim 1, wherein said integrated analog-to-digital converter is configured to rely on a reference voltage of no more than 2 V.

4. The detection circuit according to claim 1, wherein said integrated analog-to-digital converter is configured to rely on a reference voltage of approximately 1.7 V.

5. The detection circuit according to claim 1, wherein said integrated analog-to-digital converter is configured to rely on a reference voltage of approximately 1.1 V.

6. The detection circuit according to claim 1, wherein said transformation circuit contains at least a low-pass filter.

7. The detection circuit according to claim 6, wherein said low-pass filter contains at least a capacitor and at least a resistor.

8. The detection circuit according to claim 7, wherein said capacitor is configured to drive an extra current through a mechanical switch, such that any oxide layers on any contact surfaces of the mechanical switch are mitigated.

9. The detection circuit according to claim 8, wherein said capacitor is configured to drive the extra current through the mechanical switch, such that any said oxide layers on any said contact surfaces of the mechanical switch are cleared.

10. The detection circuit according to claim 7, wherein said capacitor is directly connected to a sensor.

11. The detection circuit according to claim 7, wherein said capacitor is connected to a sensor via said resistor.

12. The detection circuit according to claim 1, wherein said transformation circuit has at least an attenuation element.

13. The detection circuit according to claim 12, wherein said attenuation element has at least two resistors.

14. The detection circuit according to claim 1, further comprising a sensor connected to said transformation circuit.

15. The detection circuit according to claim 14, wherein said sensor is selected from the group consisting of a resistor with a resistance of up to 1.5 k Ohm, a resistor with a resistance of up to 1 M Ohm, a switch, and a voltage source.

* * * * *